US012656692B2

(12) United States Patent
Shin et al.

(10) Patent No.: US 12,656,692 B2
(45) Date of Patent: Jun. 16, 2026

(54) METHOD OF MANAGING SEMICONDUCTOR PROCESSING APPARATUS

(71) Applicant: SAMSUNG ELECTRONICS CO., LTD., Suwon-si (KR)

(72) Inventors: Junho Shin, Suwon-si (KR); Seungbeom Park, Suwon-si (KR); Jangwoon Sung, Suwon-si (KR); Hojun Lee, Suwon-si (KR); Wookrae Kim, Suwon-si (KR); Myungjun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 365 days.

(21) Appl. No.: 18/373,030

(22) Filed: Sep. 26, 2023

(65) Prior Publication Data

US 2024/0272561 A1     Aug. 15, 2024

(30) Foreign Application Priority Data

Feb. 15, 2023     (KR) ........................ 10-2023-0020242

(51) Int. Cl.
*G03F 7/00*          (2006.01)
*G06T 7/00*          (2017.01)

(52) U.S. Cl.
CPC ........ *G03F 7/706839* (2023.05); *G03F 7/706* (2013.01); *G03F 7/70641* (2013.01); *G06T 7/001* (2013.01); *G06T 2207/30148* (2013.01)

(58) Field of Classification Search
CPC .............. G03F 7/706839; G03F 7/706; G03F 7/70641; G03F 7/705; G03F 7/70591; (Continued)

(56) References Cited

U.S. PATENT DOCUMENTS 7,280,184 B2    10/2007  Hasegawa et al.
8,351,050 B2    1/2013  Ouchi
(Continued)

FOREIGN PATENT DOCUMENTS

EP          1439427 A2      7/2004
EP          3964809 A1      3/2022
WO      2013/139483 A2      9/2013

*Primary Examiner* — Jacky X Zheng
(74) *Attorney, Agent, or Firm* — Sughrue Mion, PLLC

(57)          ABSTRACT
Provided is a method of managing a semiconductor processing apparatus, including irradiating, by a light source, a plurality of regions included in a diffuser on a mask stage with extreme ultraviolet (EUV) light, reflecting or transmitting, by the diffuser, the EUV light, transmitting, by an optical system, the EUV light from the diffuser, receiving, by an image sensor, the EUV light from the optical system, obtaining, by the image sensor, a plurality of original images corresponding to the plurality of regions, generating, based on an optical prediction model, a plurality of predictive images estimating a diffraction pattern in the image sensor, adjusting an optical prediction model by comparing the plurality of predictive images with the plurality of original images, and generating, based on the optical prediction model, a plurality of wavefront images corresponding to optical characteristics of each of the plurality of mirrors.

15 Claims, 16 Drawing Sheets

(58) Field of Classification Search
CPC ......... G06T 7/001; G06T 2207/30148; G01M
11/005; G01M 11/0242
USPC ......................................................... 382/144
See application file for complete search history.

(56) References Cited

U.S. PATENT DOCUMENTS

| | | | |
|---|---|---|---|
| 8,760,625 B2 | 6/2014 | Rooijakkers | |
| 9,175,953 B2 | 11/2015 | Kuramoto | |
| 9,335,206 B2 | 5/2016 | Zhang et al. | |
| 10,648,919 B2 | 5/2020 | Witte et al. | |
| 2022/0180503 A1* | 6/2022 | Oh ........................... | G06F 18/22 |

* cited by examiner

600

610

620

630

800

0 INTENSITY 1

810

900

904
903
902
901

1000

0    INTENSITY    1

1010

1020

π

PHASE

−π

1030

π

PHASE

−π

METHOD OF MANAGING SEMICONDUCTOR PROCESSING APPARATUS

CROSS-REFERENCE TO RELATED APPLICATION

This application claims priority to Korean Patent Application No. 10-2023-0020242 filed on Feb. 15, 2023 in the Korean Intellectual Property Office, the disclosure of which is incorporated herein by reference in its entirety.

BACKGROUND

Embodiments of the present disclosure relate to a method of managing a semiconductor processing apparatus.

A semiconductor process may include a photo process, an etching process, a deposition process, and the like for forming a plurality of layers on a substrate, and a plurality of patterns may be formed on each of the plurality of layers. As line widths and intervals of a plurality of patterns are gradually being reduced, a photolithography process using light having a relatively short wavelength band, for example, extreme ultraviolet (EUV) light, has been proposed.

SUMMARY

According to an aspect of an example embodiment, there is provided a method of managing a semiconductor processing apparatus, the method including irradiating, by a light source, a plurality of regions included in a diffuser on a mask stage with extreme ultraviolet (EUV) light, reflecting or transmitting, by the diffuser, the EUV light, transmitting, by an optical system, the EUV light from the diffuser, receiving, by an image sensor, the EUV light from the optical system, obtaining, by the image sensor, a plurality of original images corresponding to the plurality of regions, generating, based on an optical prediction model to which optical characteristics of the light source, the diffuser, and the plurality of mirrors are applied, a plurality of predictive images estimating a diffraction pattern in the image sensor, adjusting an optical prediction model by comparing the plurality of predictive images with the plurality of original images, until consistency between the plurality of predictive images and the plurality of original images is obtained, and generating, based on the optical prediction model, a plurality of wavefront images corresponding to optical characteristics of each of the plurality of mirrors, based on the consistency between the plurality of predictive images and the plurality of original images being obtained.

According to another aspect of an example embodiment, there is provided a method of managing a semiconductor processing apparatus, the method including generating a predictive image configured to estimate a diffraction pattern of extreme ultraviolet (EUV) light reflected from a diffuser and a plurality of mirrors, based on phase aberration between incident light and outgoing light of the diffuser and each of the plurality of mirrors, comparing an original image corresponding to a real diffraction pattern of the EUV light reflected from the diffuser and the plurality of mirrors with the predictive image, adjusting phase aberration of at least one of the plurality of mirrors such that the original image and the predictive image match each other, obtaining a plurality of wavefront images corresponding to phase aberration of the diffuser and each of the plurality of mirrors, based on the original image and the predictive image matching each other, and diagnosing the diffuser and each of the plurality of mirrors based on the plurality of wavefront images.

According to another aspect of an example embodiment, there is provided a method of managing a semiconductor processing apparatus, the method including obtaining an original image corresponding to a diffraction pattern of extreme ultraviolet (EUV) light, diffused by a diffuser and transmitted through an optical system, generating a diffusion prediction model arbitrarily corresponding to diffusion characteristics of the EUV light, generating a mirror prediction model configured to predict phase aberration between the EUV light incident on and the EUV light outgoing from each of a plurality of mirrors included in the optical system, obtaining a predictive image configured to estimate a diffraction pattern of the EUV light, diffused by the diffuser and transmitted through the optical system, by executing a forward propagation operation based on an optical prediction model including the diffusion prediction model and the mirror prediction model, and executing a backward propagation operation based on the optical prediction model to reduce a difference between the predictive image and the original image.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
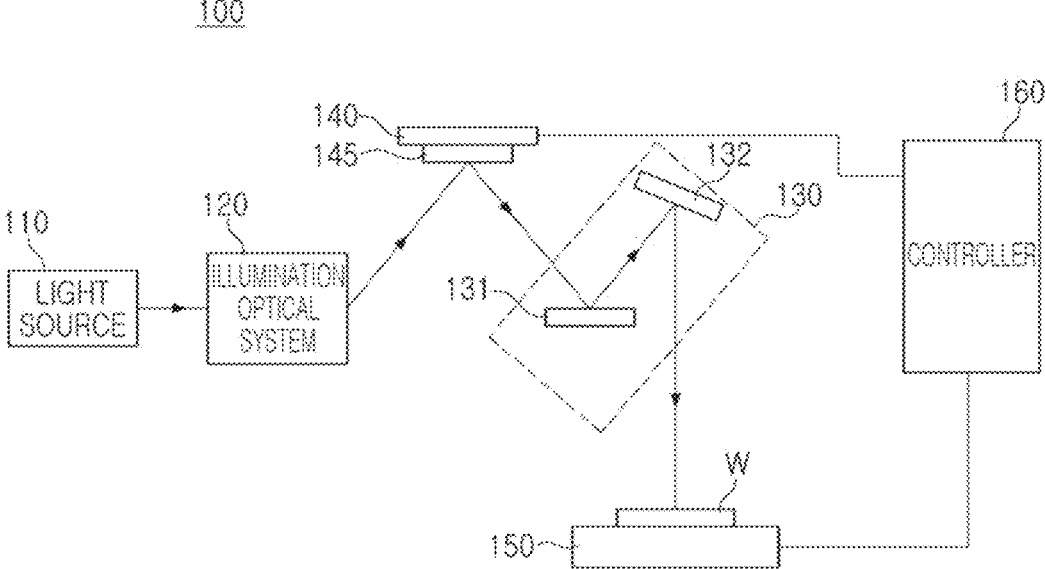
FIG. 1 is a diagram illustrating a semiconductor processing apparatus according to an example embodiment.

FIG. 1 is a diagram illustrating a semiconductor processing apparatus according to an example embodiment.

Referring to FIG. 1, a semiconductor processing apparatus 100 according to an example embodiment, an apparatus for performing a photolithography process, may include a light source 110, an illumination optical system 120, an optical system 130, a mask stage 140, a wafer stage 150, and a controller 160.

The light source 110 may generate and emit EUV light having high energy density within a wavelength range of several nanometers to several tens of nanometers. In some example embodiments, the light source 110 may generate and output EUV light having a relatively high energy density in a wavelength band of 13.5 nm. The light source 110 may include a plasma-based light source or a synchrotron radiation light source. The plasma-based light sources may be a light source using a method of generating plasma and using light emitted by the plasma, and may include a laser-produced plasma (LPP) light source or a discharge-produced plasma (DPP) light source. For example, when the light source 110 includes the plasma-based light source, the light source 100 may further include a condensing mirror such as an elliptical mirror, a spherical mirror, or the like for increasing energy density of EUV light incident on the illumination optical system 120.

The illumination optical system 120 may include a plurality of mirrors. In the semiconductor processing apparatus 100 according to an example embodiment, the illumination optical system 120 may include two or three mirrors. However, the number of mirrors included in the illumination optical system 120 is not necessarily limited to two or three. The illumination optical system 120 may transfer EUV light emitted from the light source 110 to the mask stage 140. The EUV light, emitted from the light source 110, may be reflected by the mirrors included in the illumination optical system 120, and may be incident on the mask 145 mounted on the mask stage 140. In an example embodiment, the illumination optical system 120 may form EUV light to be in a curved slit, and may transmit the EUV light to be incident on the mask 145.

In an example embodiment, the mask 145 may be a reflective mask having a non-reflection region and/or an intermediate reflection region, together with a reflection region. The mask 145 may include a reflective multilayer film for reflecting EUV light on a substrate formed of a low thermal expansion coefficient material (LTEM) such as quartz, and an absorption layer pattern formed on the reflective multilayer film. The reflective multilayer film may have a structure in which, for example, a molybdenum film (Mo layer) and a silicon film (Si layer) are alternately stacked. The absorption layer may be formed of tantalum nitride (TaN), tantalum nitrogen oxide (TaNO), tantalum boron oxide (TaBO), nickel (Ni), gold (Au), silver (Ag), carbon (C), tellurium (Te), platinum (Pt), palladium (Pd), chromium (Cr), or the like. However, the material of the reflective multilayer film and the material of the absorption layer are not limited to the above-described materials, and the absorption layer may correspond to the non-reflection region and/or the intermediate reflection region described above.

The mask 145 may reflect EUV light incident through the illumination optical system 120 to be incident on the optical system 130. The optical system 130 may be an imaging optical system disposed between the mask stage 140 and the wafer stage 150. For example, the EUV light, passing through the illumination optical system 120, may be structured according to a shape of a pattern including a reflective multilayer film and an absorption layer on a substrate in the mask 145, and may be incident on the optical system 130. The EUV light may be structured to include at least second-order diffracted light, based on the pattern on the mask 145. The structured EUV light may be incident on the optical system 130 in a state of retaining information on the pattern shape included in the mask 145, and a wafer W may be irradiated with the structured EUV light through the optical system 130 such that an image corresponding to the pattern shape included in the mask 145 is formed. For example, a photoresist layer, coated on the wafer W, may be irradiated with the structured EUV light, and a predetermined pattern may be formed on the photoresist layer.

The optical system 130 may include a plurality of mirrors. In the example embodiment illustrated in FIG. 1, the optical system 130 is illustrated as including a first mirror 131 and a second mirror 132, but embodiments are not limited thereto, and the optical system 130 may include three or more mirrors. For example, in the semiconductor processing apparatus 100, the optical system 130 may include four to eight mirrors.

EUV light, reflected by the mask 145 and passing through the optical system 130, may be incident on an upper surface of the wafer W while forming a predetermined inclination with respect to the upper surface of the wafer W. For example, the optical system 130 may adjust a travel path of the EUV light such that the EUV light is incident on the upper surface of the wafer W while forming an angle of about 6 degrees with respect to the upper surface of the wafer W.

The mask 145 may be mounted on the mask stage 140, and the wafer W may be mounted on the wafer stage 150. For example, the mask stage 140 and the wafer stage 150 may be controlled by the controller 160. In an initial state in which the mask 145 and the wafer W are mounted on the mask stage 140 and the wafer stage 150, respectively, when an upper surface of each of the mask 145 and the wafer W is defined as an X-Y plane, each of the mask stage 140 and the wafer stage 150 may be moved by the controller 160. In an example embodiment, the controller 160 rotates each of the mask stage 140 and the wafer stage 150 on an X-Y plane with respect to a Z-axis, or rotates each of the mask stage 140 and the wafer stage 150 on a Y-Z plane or an X-Z plane with respect to any one axis of the X-Y plane. By the movement of the mask stage 140 and/or the wafer stage 150 described above, the mask 145 and/or the wafer W may move or rotate along an X-axis, Y-axis, and Z-axis in a three-dimensional space.

In order to increase yield of the photolithography process using EUV light and more accurately form a desired pattern on the wafer W, issues such as contamination and particles of optical elements including the light source 110, the illumination optical system 120, and the optical system 130 may need to be addressed. To this end, various methods of monitoring states of the optical elements have been proposed, but only a method of monitoring only an overall state of the entire equipment including the light source 110, the illumination optical system 120, and the optical system 130 has been proposed. Accordingly, a large amount of time and cost may be required for the management, maintenance, and repair of the semiconductor processing apparatus 100, and the efficiency and yield of the semiconductor process may be reduced.

In an example embodiment is directed to a method capable of individually monitoring a state of each of the mirrors included in the illumination optical system 120 and the optical system 130, and a state of the light source 110. Accordingly, when the yield of the semiconductor process is reduced, a part having an issue such as contamination and/or particles may be more rapidly specified, and a maintenance and repair operation may be performed. As a result, the efficiency and yield of the semiconductor process may be improved.

Figure 2:
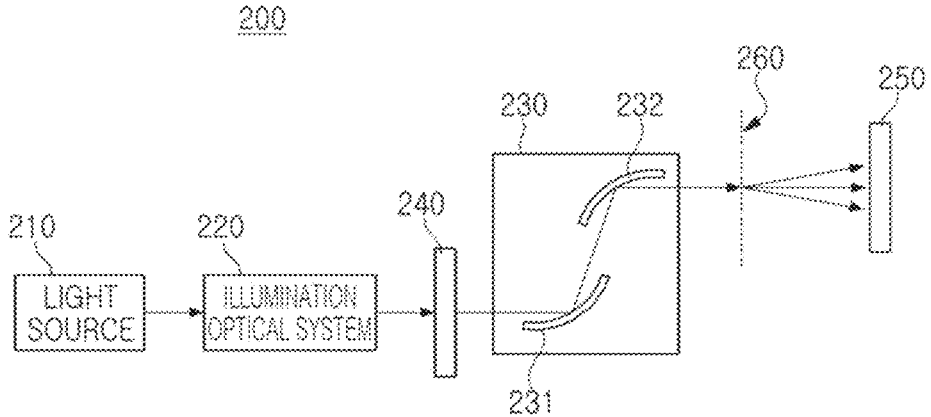
FIG. 2 is a diagram illustrating a method of managing a semiconductor processing apparatus according to an example embodiment.

FIG. 2 is a diagram illustrating a method of managing a semiconductor processing apparatus according to an example embodiment.

Referring to FIG. 2, a semiconductor processing apparatus 200 according to an example embodiment may be an apparatus performing a photolithography process using EUV light. The semiconductor processing apparatus 200 may include a light source 210, an illumination optical system 220, an optical system 230, and the like. A method of managing a semiconductor processing apparatus according to an example embodiment may be performed to individually determine states of optical elements included in each of the light source 210, the illumination optical system 220, and the optical system 230.

Referring to FIG. 2, a diffuser 240 and an image sensor 250 may be installed in a semiconductor processing apparatus in order to perform the method of managing a semiconductor processing device according to an example embodiment. The diffuser 240 may be installed on a mask stage instead of a mask, and the image sensor 250 may be installed on a wafer stage instead of a wafer. For example, the image sensor 250 may be a CCD sensor or a CMOS sensor included in a camera.

Positions of the mask stage and/or the wafer stage may be adjusted such that the image sensor 250 is disposed in a position other than a focal plane 260 of EUV light, passing through the optical system 230. In the example embodiment illustrated in FIG. 2, the image sensor 250 is illustrated as being disposed on a rear side of the focal plane 260. However, in some example embodiments, the image sensor 250 may be disposed on a conjugate focal plane, a front side of the focal plane 260.

EUV light, output by the light source 210 and passing through the illumination optical system 220, may be reflected from the diffuser 240 or may be transmitted through the diffuser 240 to be incident on the optical system 230. The optical system 230 may include a plurality of mirrors such as a first mirror 231 and a second mirror 232, reflecting EUV light. EUV light, passing through the optical system 230, may be incident on the image sensor 250, and the image sensor 250 may generate an original image representing a diffraction pattern of the incident EUV light.

A diffraction pattern of EUV light, focused on the focal plane 260 and incident on the image sensor 250, may be determined according to optical characteristics of each of optical elements such as the light source 210, the illumination optical system 220, the optical system 230, and the diffuser 260. For example, the optical characteristics of each of the optical elements may include at least one of amplitude modulation and phase aberration between incident light and outgoing light.

Optical characteristics of each of optical elements included in the light source 210, the illumination optical system 220, and the optical system 230, among the optical elements included in the semiconductor processing apparatus 200, may be converted into a predetermined prediction model. In the method according to an example embodiment, a predictive image, estimating a diffraction pattern of EUV light incident on the image sensor 250, may be generated by executing a forward propagation operation using prediction models. In this case, optical characteristics of the diffuser 260, for example, phase aberration of EUV light transmitted through or reflected from the diffuser 260 may be arbitrarily set.

A predictive image initially generated by the forward propagation operation may have a large difference from an original image actually generated by the image sensor 250. In the method according to an example embodiment, a backward propagation operation may be executed using a difference between the original image and the predictive image. Optical characteristics of at least one of the light source 210, the illumination optical system 220, the optical system 230, and the diffuser 240 may be adjusted by the backward propagation operation. For example, in the backward propagation operation, a prediction model representing optical characteristics of at least one of the optical elements may be modified by the difference between the original image and the predictive image. For example, a weight, ratio, and the like of the prediction model applied between incident light and outgoing light may be changed.

When the back propagation operation is completed, a new predictive image may be generated by re-executing the forward propagation operation using the modified prediction model. The new predictive image may be compared to the original image, and a backward propagation operation, based on the difference, may be executed again. Thus, the forward propagation operation and the back propagation operation may be repeatedly executed. In an example embodiment, the forward propagation operation and the back propagation operation may be repeatedly executed until consistency between the predictive image generated by the forward propagation operation and the original image generated by the image sensor 260 is recognized. For example, when the backward propagation operation is completed, the predictive image may be regenerated to determine whether the predictive image matches the original image.

Whether consistency between the predictive image and the original image is recognized may be determined by the difference between the predictive image and the original image. When consistency with the original image is recognized, for example, when the predictive image and the original image match each other, a wavefront image, representing the optical characteristics of each of the optical elements, may be generated using an arithmetic expression of the forward propagation operation, defining the optical characteristics of each of the optical elements. Accordingly, a plurality of wavefront images, corresponding to the optical elements such as the light source 210, the illumination optical system 220, and the optical system 230, may be generated. For example, a wavefront image, representing optical characteristics of the first mirror 231 included in the optical system 230, and a wavefront image, representing optical characteristics of the second mirror 232, may be individually generated.

A wavefront image, corresponding to each of the optical elements, may represent amplitude modulation, phase aberration, and the like between incident light and outgoing light of each of the optical elements. In some example embodiments, a wavefront image, representing amplitude modulation, and a wavefront image, representing phase aberration, may be generated with respect to one optical element. Thus, with reference to a wavefront image generated with respect to each optical element, an optical element having an issue such as contamination, aberration errors, particles, or the like, among the optical elements of the semiconductor processing apparatus 200, may be more rapidly specified, and an maintenance and repair operation may be performed.

Figure 3:
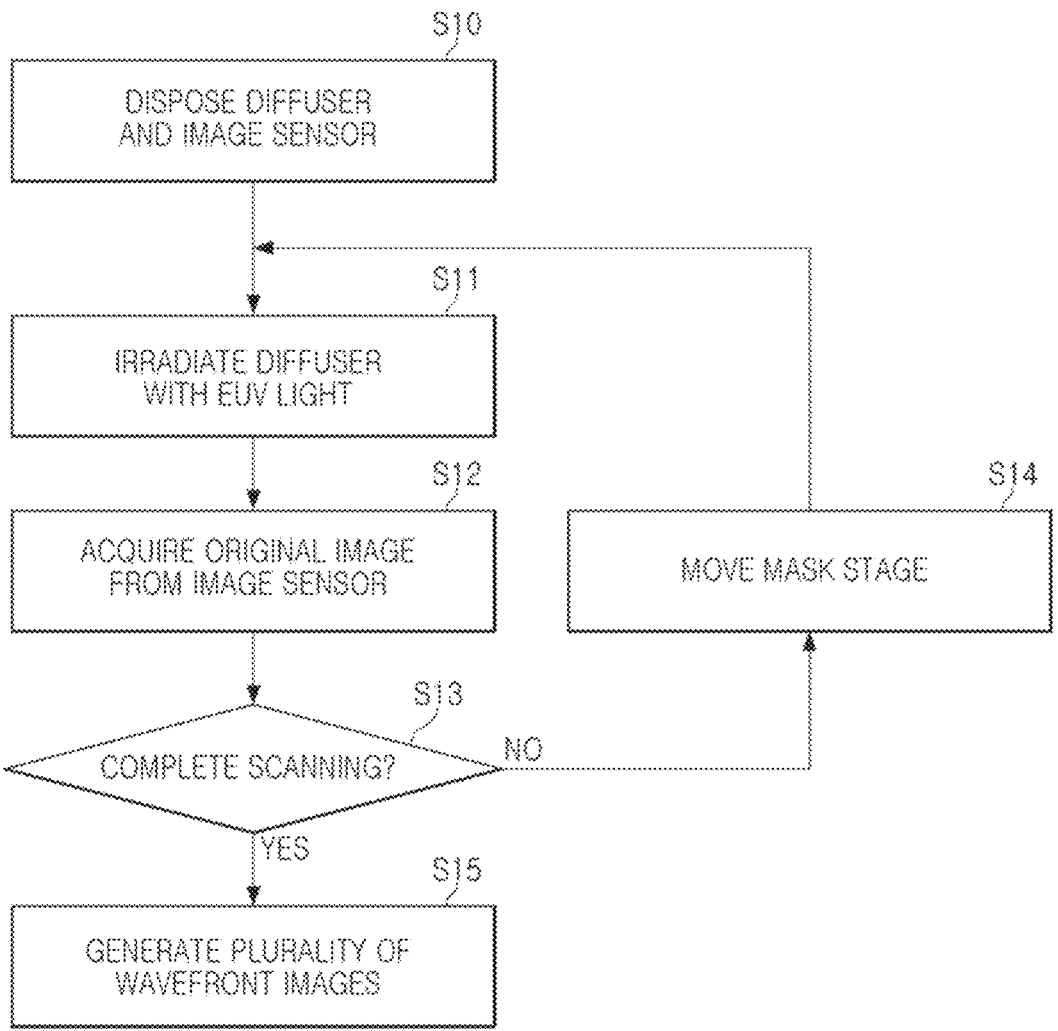
FIG. 3 is a flowchart illustrating a method of managing a semiconductor processing apparatus according to an example embodiment.

FIG. 3 is a flowchart illustrating a method of managing a semiconductor processing apparatus according to an example embodiment.

Referring to FIG. 3, the method of managing a semiconductor processing apparatus according to an example embodiment may include disposing a diffuser and an image sensor (S10). As described above, the diffuser may be disposed on a mask stage of the semiconductor processing apparatus, and the image sensor may be disposed on a wafer stage of the semiconductor processing apparatus.

When the diffuser and the image sensor are respectively disposed on the mask stage and the wafer stage, a controller of the semiconductor processing apparatus may operate a light source to irradiate the diffuser with EUV light (S11). The diffuser may transmit or reflect EUV light, and the EUV light, transmitted or reflected by the diffuser, may be incident on the image sensor through an optical system including a plurality of mirrors. The controller may acquire, from the image sensor, an original image representing a diffraction pattern of the EUV light (S12).

The controller, acquiring the original image, may determine whether a scanning operation is completed (S13). In an example embodiment, a region that may be irradiated by the light source with EUV light at once, simultaneously, may not cover the entire region of the diffuser. In an example embodiment, the controller of the semiconductor processing apparatus may irradiate the diffuser with EUV light multiple times while moving the light source or the mask stage until the entire region of the diffuser is covered.

For example, the controller may irradiate each of a plurality of regions included in the diffuser with EUV light while moving the mask stage (S14). When each of the plurality of regions is irradiated with EUV light at least once, the controller may determine that the scanning operation is completed, and may generate a plurality of wavefront images (S15). An operation of generating the plurality of wavefront images may include a forward propagation operation and a back propagation operation, as described above. A light output surface of the light source and a state of a surface of each of the plurality of mirrors included in the optical system between the diffuser and the wafer stage may be diagnosed based on the plurality of wavefront images.

Figure 4:
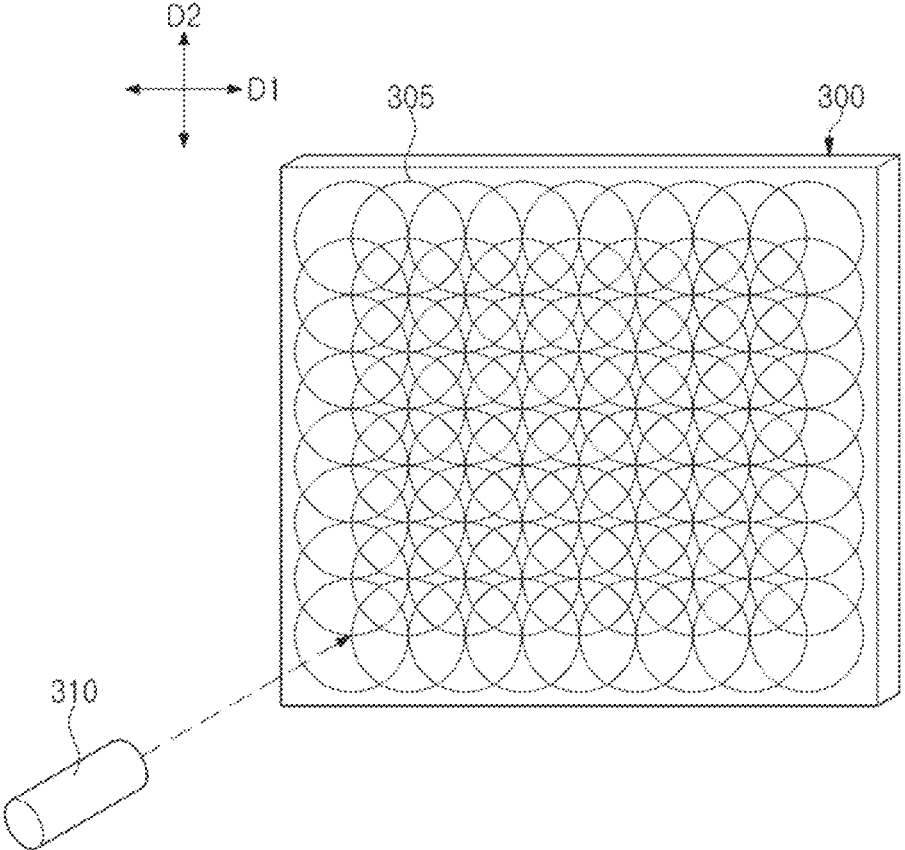
FIG. 4 is a diagram illustrating a method of managing a semiconductor processing apparatus according to an example embodiment.
Figure 5A:
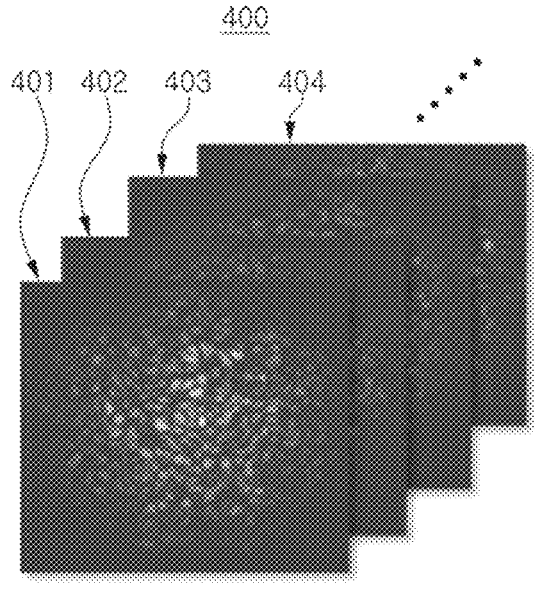
FIGS. 5A and 5B are diagrams illustrating a method of managing a semiconductor processing apparatus according to an example embodiment.
Figure 5B:
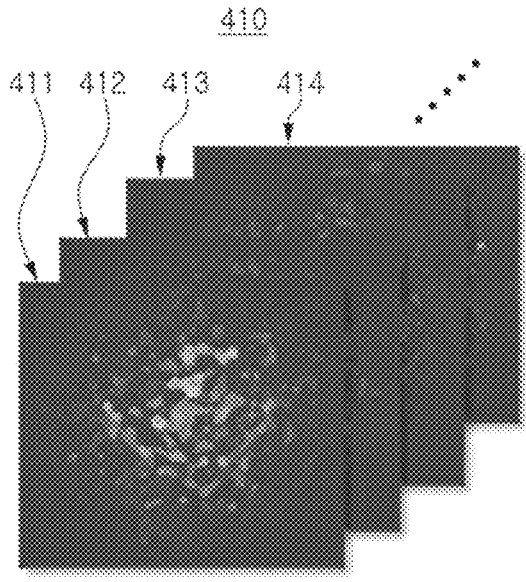

FIG. 4 is a diagram illustrating a method of managing a semiconductor processing apparatus according to an example embodiment. FIGS. 5A and 5B are diagrams illustrating a method of managing a semiconductor processing apparatus according to an example embodiment.

Referring first to FIG. 4, a plurality of regions 305 may be defined in the diffuser 300. Each of the plurality of regions 305 may have an area that may be irradiated with EUV light, output by a light source 310, at once. The plurality of regions 305 may be arranged in a first direction D1 and a second direction D2, parallel to a surface of the diffuser 300.

As illustrated in FIG. 4, each of the plurality of regions 305 may overlap at least another region 305 in at least one of the first direction D1 and the second direction D2. While the light source 310 irradiates EUV light such that at least portions of the plurality of regions 305 overlaps each other, a controller may acquire, from an image sensor, a plurality of original images 400 (401, 402, 403, and 404), as illustrated in FIG. 5A. For example, the number 400 of the plurality of original images 400 may be equal to the number of the plurality of regions 305.

Each of the plurality of original images 400 may be compared with each of a plurality of predictive images 410 (411, 412, 413, and 414). Each of the plurality of predictive images may be an image predicting a diffraction pattern of EUV light, output by the light source 310 and incident on an image sensor through the diffuser 300 and an optical system. For example, when a predictive image is generated by more accurately reflecting optical characteristics of EUV light output by the light source 310, optical characteristics of the diffuser 300, and optical characteristics of the optical system, the predictive image and the original image may be significantly similar to each other. In addition, consistency between the predictive image and the original image may be obtained.

The plurality of predictive images 410 may be generated with respect to the plurality of regions 305 defined in the diffuser 300. For example, a first predictive image 411 generated with respect to a first region, among the plurality of regions 305, may be compared with a first original image 401 generated by the image sensor when EUV light reflected from the first region is incident on the image sensor. Similarly, a second predictive image 412, corresponding to a second region, may be compared with a second original image 402, representing a diffraction pattern of EUV light reflected from a second region.

The controller of the semiconductor processing apparatus may modify each of the plurality of predictive images 410 until consistency between the plurality of original images 400 corresponding to the plurality of regions 305 and the plurality of predictive images 410 is obtained. When consistency between the plurality of original images 400 and the plurality of predictive images 410 is obtained, a state of the semiconductor processing apparatus may be diagnosed using the optical characteristics of the light source 310, the diffuser 300, and the optical system applied to generate the plurality of predictive images 410.

Figure 6:
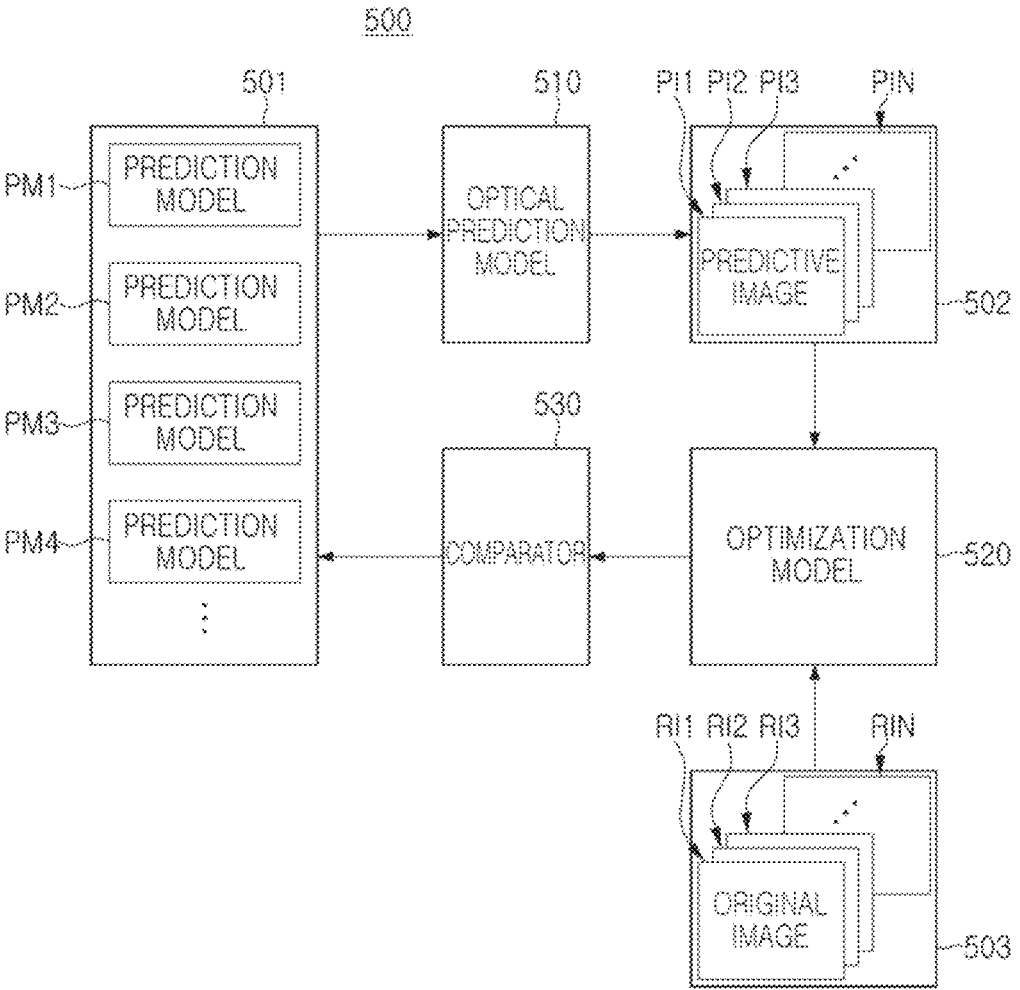
FIG. 6 is a diagram illustrating a method of managing a semiconductor processing apparatus according to an example embodiment.

FIG. 6 is a diagram illustrating a method of managing a semiconductor processing apparatus according to an example embodiment. FIGS. 7A to 7D are diagrams illustrating optical characteristics of optical elements applied to a semiconductor processing apparatus according to an example embodiment.

Referring to FIG. 6, a controller 500 of a semiconductor processing apparatus according to an example embodiment may include an optical prediction model 510, a comparator 520, an optimization model 530, and the like. The optical prediction model 510 may be generated based on an optical data set 501, and may generate a predictive image set 502. The comparator 520 may output a result of comparison between the predictive image set 502 and an original image set 503, and the optimization model 530 may adjust an algorithm based on the result of comparison.

The optical data set 501 may include information on a plurality of prediction models PM1, PM2, PM3, and PM4, and the plurality of prediction models PM1 to PM4 may correspond to optical elements included in the semiconductor processing apparatus. For example, a first prediction model PM1 may correspond to a light source, and may include an algorithm, an arithmetic expression, and the like for predicting optical characteristics of EUV light output by the light source. For example, the first prediction model PM1 may estimate optical characteristics of EUV light output by the light source, for example, intensity distribution and/or phase distribution of EUV light according to a position of a light output surface. A second prediction model PM2 may estimate phase aberration and/or amplitude modulation between incident light and outgoing light in some regions of a diffuser transmitting or reflecting EUV light.

A third prediction model PM3 may include an arithmetic expression, an algorithm, and the like for estimating optical characteristics of a first mirror included in an optical system disposed between a mask stage on which a diffuser is disposed and a wafer stage on which an image sensor is disposed. For example, the third prediction model PM3 may estimate phase aberration and/or amplitude modulation between incident light and outgoing light of the first mirror. A fourth prediction model PM4 may estimate phase aberration and/or amplitude modulation between incident light and outgoing light of a second mirror disposed at a rear end of the first mirror in the optical system.

An image representing characteristics of EUV light, output by the light source and transmitted through and/or reflected from the diffuser and the optical system, may be generated using the first to fourth prediction models PM1 to PM4. For example, each of the first to fourth prediction models PM1 to PM4 may represent phase aberration occurring between incident light and output light in the form of an image on a light output surface, perpendicular to an optical axis or surfaces of optical elements such as the diffuser, mirror, and the like. Assuming that a phase of EUV light output at first coordinates of the first prediction model PM1 is a first phase, the phase of the EUV light may be calculated at specific coordinates of a surface corresponding to the wafer stage, using phase aberration of each of the second prediction model PM2, corresponding to the diffuser, the third prediction model corresponding to the first mirror, and the fourth prediction model PM4 corresponding to the second mirror.

Figure 7A:
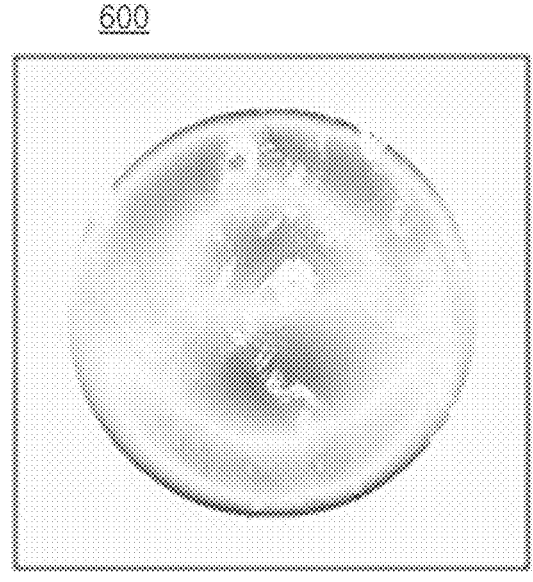
FIGS. 7A, 7B, 7C, and 7D are diagrams illustrating optical characteristics of optical elements applied to a semiconductor processing apparatus according to an example embodiment.

FIGS. 7A to 7D are diagrams illustrating optical characteristics of each of optical elements matching the first to fourth prediction models PM1 to PM4. For example, FIG. 7A may be a diagram illustrating phase distribution according to a position, on a light output surface 600 of EUV light output by a light source. Referring to FIG. 7A, a phase close to +180 degrees may occur along a boundary of a light output surface in an upper semicircle, and a phase close to −180 degrees may occur along a boundary of a light output surface in a lower semicircle. In addition, phases of EUV light may occur in a symmetrical form in the upper semicircle and the lower semicircle.

Figure 7B:
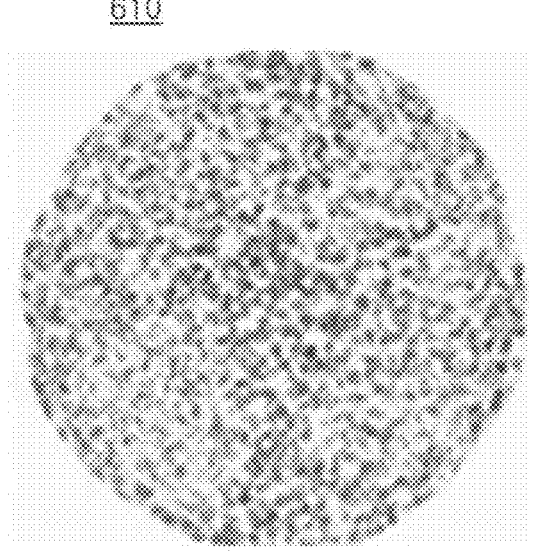

FIG. 7B may be a diagram illustrating phase aberration in some regions of a diffuser 610 transmitting or reflecting EUV light. The phase aberration illustrated in FIG. 7B may represent a phase difference between light incident on each position and light outgoing from each position.

Figure 7C:
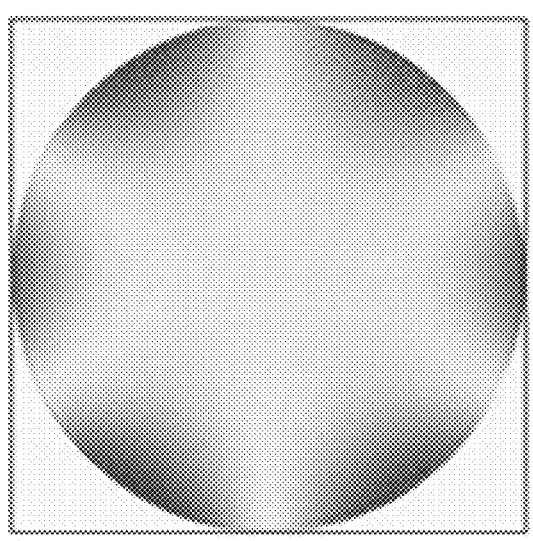

FIG. 7C may be a diagram illustrating phase aberration on a surface of a first mirror 620 of an optical system disposed between a mask stage and a wafer stage. Referring to FIG. 7C, almost no phase difference between incident light and outgoing light may be present in a region close to the center of the first mirror 620, and a phase difference between the incident light and the outgoing light may be present only in a region close to a boundary of the first mirror 602.

Figure 7D:
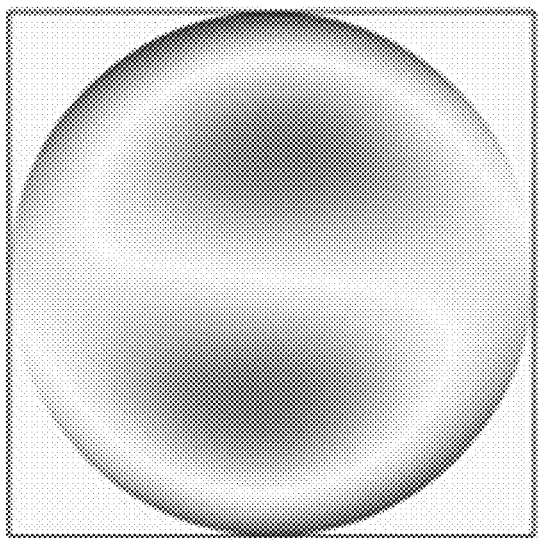

FIG. 7D may be a diagram illustrating phase aberration on a surface of a second mirror 630 disposed at a rear end of the first mirror 620 in the optical system. Referring to FIG. 7D, even in the second mirror 630, a phase difference may occur between incident light and outgoing light only in some regions.

An optical prediction model 510 may be generated using an algorithm, an arithmetic expression, or the like that may be processed in a controller, by optical characteristics of each of optical elements, as illustrated in FIGS. 7A to 7D.

For example, the controller 500 of the semiconductor processing apparatus may, in advance, recognize optical characteristics of a light output surface of a light source 600 and optical characteristics of respective surfaces of the first mirror 620 and the second mirror 630. Accordingly, the controller 500 may configure the optical prediction model 510, based on a plurality of prediction models representing the optical characteristics recognized in advance with respect to the light output surface of the light source 600, the surface of the first mirror 620, and the surface of the second mirror 630.

The controller 500 may generate an arbitrary prediction model with respect to optical characteristics of the diffuser 610 and apply the arbitrary prediction model to the optical prediction model 510. When the optical prediction model 510 is configured by generating an arbitrary prediction model with respect to the diffuser 610, it may not be necessary to form the diffuser 610 having a predetermined diffusion characteristic, thereby reducing costs required for manufacturing the diffuser 610 necessary for diagnosis of the semiconductor processing apparatus. However, when the optical characteristics of the diffusers 610 are recognized in advance, a prediction model corresponding to real optical characteristics of the diffusers 610 may be generated and applied to configure the optical prediction model 510.

The controller 500 may execute the optical prediction model 510 configured by optical characteristics of each of the light source 600, the diffuser 610, the first mirror 620, and the second mirror 630 to acquire a plurality of predictive images PIT to PIN. A forward propagation operation in which the optical characteristics of each of the light source 600, the diffuser 610, the first mirror 620, and the second mirror 630 are reflected may be executed by the optical prediction model 510. For example, as illustrated in FIG. 4, each of the plurality of predictive images PIT to PIN may be an image predicting a diffraction pattern of EUV light, transmitted or reflected by regions defined in the diffuser 610 and sequentially reflected from the first mirror 620 and the second mirror 630.

For example, a first predictive image PIT may be an image predicting a diffraction pattern of EUV light transmitted through or reflected from a first region of the diffuser 610 and then sequentially reflected from the first mirror 620 and the second mirror 630. A second predictive image PI2 may be an image predicting a diffraction pattern of EUV light transmitted through or reflected from a second region of the diffuser 610 and then sequentially reflected from the first mirror 620 and the second mirror 630.

The comparator 520 may compare the plurality of predictive images PIT to PIN with a plurality of original images RI1 to RIN, respectively. For example, the comparator 520 may compare an i-th (i is a natural number less than or equal to N) predictive image PIi with an i-th original image RIi. As described above, the i-th predictive image PIi may be an image predicting a diffraction pattern of EUV light transmitted or reflected by an i-th region of the diffuser 610 and sequentially reflected from the first mirror 620 and the second mirror 630. The i-th original image RIi may be an image generated by an image sensor in a state in which the i-th region of the diffuser 610 is actually irradiated with EUV light.

The optimization model 530 may modify the optical data set 501 including optical characteristics required to configure the optical prediction model 510 according to a result of comparison executed by the comparator 520. For example, the optimization model 530 may optimize the optical data set 501 by executing a backward propagation operation using a difference between the plurality of predictive images PIT to PIN and the plurality of original images RI1 to RIN, and may modify the optical prediction model 510 accordingly.

The controller 500 may modify the optical prediction model 510 until consistency between the plurality of predictive images PIT to PIN, generated by the optical prediction model 510, and the plurality of original images RI1 to RIN is recognized. Hereinafter, an operation of the controller 500 will be described in more detail with reference to FIG. 8.

Figure 8:
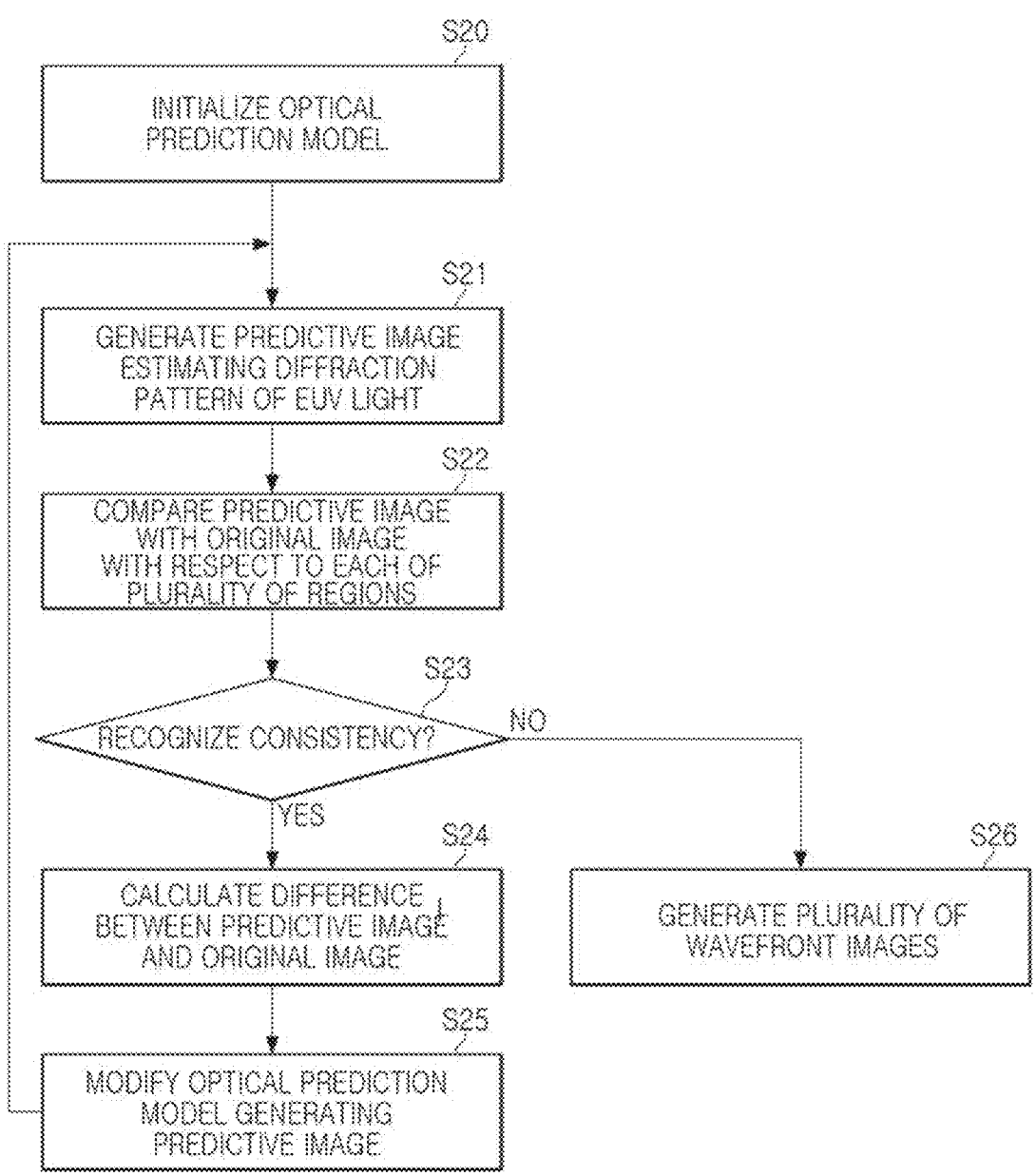
FIG. 8 is a flowchart illustrating a method of managing a semiconductor processing apparatus according to an example embodiment.

FIG. 8 is a flowchart illustrating a method of managing a semiconductor processing apparatus according to an example embodiment.

Referring to FIG. 8, a method of managing a semiconductor processing apparatus according to an example embodiment may include initializing an optical prediction model (S20). The optical prediction model may be a model for estimating a diffraction pattern of EUV light formed when EUV light, emitted from a light source, is transmitted through or reflected from some regions of a diffuser and then passes through an optical system including a plurality of mirrors. For example, a controller may initialize an optical prediction model using intensity and phase distribution according to a position on a light output surface, perpendicular to an optical axis of EUV light emitted from the light source, phase aberration occurring in each of mirrors included in the optical system, and the like.

The intensity and phase distribution of EUV light according to the position of the light output surface, and phase aberration between incident light and outgoing light occurring in each of the mirrors included in the optical system may be information recognized in advance by the controller. In some example embodiments, the controller may arbitrarily determine diffusion characteristics of a region of a diffuser transmitting or reflecting EUV light, and apply the diffusion characteristics to initialize the optical prediction model.

The controller may generate a predictive image estimating a diffraction pattern of EUV light using an optical prediction model (S21). For example, an output of the optical prediction model may be an image representing a diffraction pattern of light. The controller may acquire a plurality of predictive images by applying the optical prediction model to each of a plurality of regions included in the diffuser. For example, intensity and phase distribution of EUV light according to a position of a light output surface and phase aberration of each of the mirrors included in the optical system may be the same. Diffusion characteristics of each of the plurality of regions included in the diffuser may be arbitrarily determined initially, and thus may be different from each other. Accordingly, at least portions of the plurality of predictive images may be generated to represent different diffraction patterns.

The controller may compare a predictive image and an original image with each other with respect to each of the plurality of regions (S22). The original image may be an image generated by an image sensor disposed on a wafer stage while one of the plurality of regions included in the diffuser is irradiated with EUV light in a state in which the diffuser is disposed on a mask stage inside the semiconductor processing apparatus. Accordingly, the original image may represent a diffraction pattern of EUV light transmitted or reflected by some regions of the diffuser, irradiated with EUV light, and reflected from the mirrors included in the optical system. The controller may acquire a plurality of original images by irradiating each of the plurality of regions with EUV light, and may compare the plurality of original images with the plurality of predictive images.

The controller may determine whether consistency between the plurality of predictive images and the plurality of original images is recognized (S23). For example, when a difference between the predictive image and the original image in each of the plurality of regions is smaller than a predetermined reference difference, consistency may be recognized.

As a result of the determination in operation S23, when consistency is not recognized in at least one of the plurality of regions, the controller may calculate the difference between the predictive image and the original image (S24), and may modify the optical prediction model based on the difference (S25). For example, the controller may modify the optical prediction model using a backward propagation operation using the difference between the predictive image and the original image. The controller may regenerate the predictive image using the modified optical prediction model (S21), compare the predictive image with the original image (S22), and determine whether consistency between the predictive image and the original image is recognized (S23).

In operation S23, when it is determined that consistency between the predictive image and the original image is recognized with respect to each of the plurality of regions, the controller may generate a plurality of wavefront images (S26). The plurality of wavefront images may be images representing optical characteristics of a light output surface, perpendicular to an optical axis of EUV light output by the light source, and a surface of each of the plurality of mirrors included in the optical system between the mask stage and the wafer stage. The controller may rapidly specify a part of the semiconductor processing apparatus having an issue such as particle, contamination, or the like, and may reduce time and cost required for a maintenance and repair operation.

Figure 9:
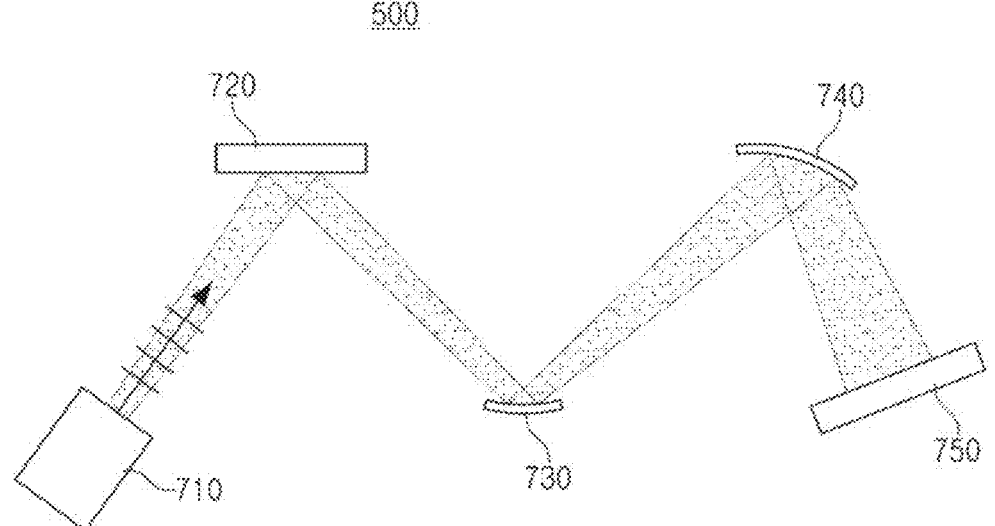
FIG. 9 is a diagram illustrating a semiconductor processing apparatus according to an example embodiment.

FIG. 9 is a diagram illustrating a semiconductor processing apparatus according to an example embodiment.

For example, a semiconductor processing apparatus 700 may be an apparatus performing a photolithography process using EUV light. In the photolithography process, predetermined patterns may be formed on a target layer of a wafer disposed on a wafer stage by EUV light transmitted or reflected by a mask disposed on a mask stage.

When the patterns formed on the target layer has degraded quality, operation of the semiconductor processing apparatus 700 may be stopped, and an operation for diagnosing an issue may be performed. Referring to FIG. 9, a diffuser 720 may be installed, instead of the mask, on the mask stage of the semiconductor processing apparatus 700, and an image sensor 750 may be installed, instead of the wafer, on the wafer stage. Thereafter, a light source 710 may output EUV light. The EUV light may be diffused by the diffuser 720, may be reflected from mirrors 730 and 740 included in the optical system, and then may be incident on the image sensor 750.

The image sensor 750 may output an original image representing a diffraction pattern of EUV light, diffused by the diffuser 720 and reflected from the mirrors 730 and 740. A controller of the semiconductor processing apparatus may generate an optical prediction model modeling optical characteristics of optical elements including the light source 710, the diffuser 720, and the mirrors 730 and 740, and the optical prediction model may be optimized to output a predictive image estimating a diffraction pattern of EUV light incident on the image sensor 750. For example, the controller may optimize the optical prediction model by comparing a predictive image output by the optical prediction model in an initial state with an original image, and executing a backward propagation operation based on a difference between the predictive image and original image.

When the optical prediction model is optimized and consistency between the predictive image and the original image is recognized, the controller may acquire a plurality of wavefront images. For example, the plurality of wavefront images may include a light source image representing optical characteristics of a light output surface, perpendicular to an optical axis C of the light source 710, a first mirror image representing phase aberration between incident light and outgoing light of a first mirror 730, a second mirror image representing phase aberration between incident light and outgoing light of a second mirror 740, and the like.

As described above, the optical prediction model may include a plurality of prediction models, estimating optical characteristics of each of the light source 710, the diffuser 720, and the mirrors 730 and 740. For example, an output of a light source prediction model, estimating optical characteristics of EUV light output by the light source 710, may be input to a diffusion prediction model, estimating diffusion characteristics of the diffuser 720, thereby generating an image representing a diffraction pattern of EUV light input to the first mirror 730. In addition, an output of a diffusion prediction model may be input to a first mirror prediction model, estimating optical characteristics of the first mirror 730 to acquire a first mirror image, representing a diffraction pattern of EUV light reflected from the first mirror 730. Finally, when an output of the first mirror prediction model is input to a second mirror prediction model estimating optical characteristics of the second mirror 740, a second mirror image, representing a diffraction pattern of EUV light reflected from the second mirror 740, may be acquired.

When consistency between the predictive image and the original image is recognized, the controller may acquire, from the optical prediction model generating the predictive image matching the original image, an output of the first mirror prediction model as the first mirror image, a wavefront image of the first mirror 730, and may acquire, from the optical prediction model generating the predictive image matching the original image, an output of the second mirror prediction model as the second mirror image, a wavefront image of the second mirror 740. When consistency between the predictive image and the original image is not recognized, the backward propagation operation may be executed using the optical prediction model to reduce the difference between the predictive image and the original image. For example, at least one of the diffusion prediction model, the first mirror prediction model, and the second mirror prediction model may be modified based on the difference between the predictive image and the original image.

Under a condition in which consistency between the predictive image and the original image is recognized, a light source image may be similar to a real image obtained on a light output surface. Similarly, the first mirror image may be similar to a real image measuring phase aberration on a surface of the first mirror 730, and the second mirror image may be a real image measuring phase aberration on a surface of the second mirror 740. Accordingly, in an example embodiment, states of optical elements included in the semiconductor processing apparatus 700, for example, the light source 710 and the mirrors 730 and 740, may be individually diagnosed.

FIGS. 10 to 13 are diagrams illustrating real optical characteristics of optical elements included in a semiconductor processing apparatus according to an example embodiment.

Figure 10:
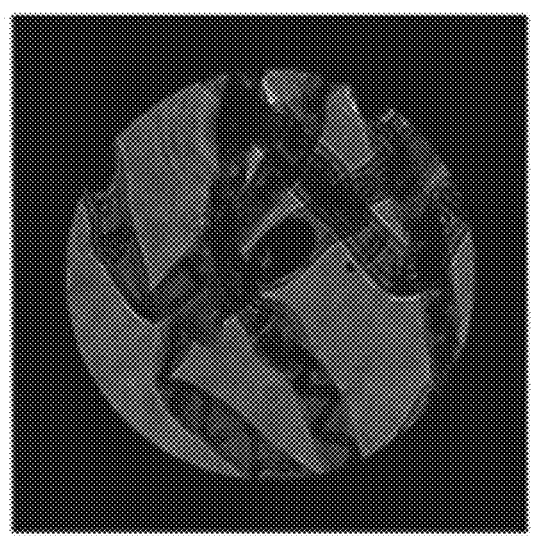
FIGS. 10, 11, 12, and 13 are diagrams illustrating real optical characteristics of optical elements included in a semiconductor processing apparatus according to an example embodiment.
Figure 11:
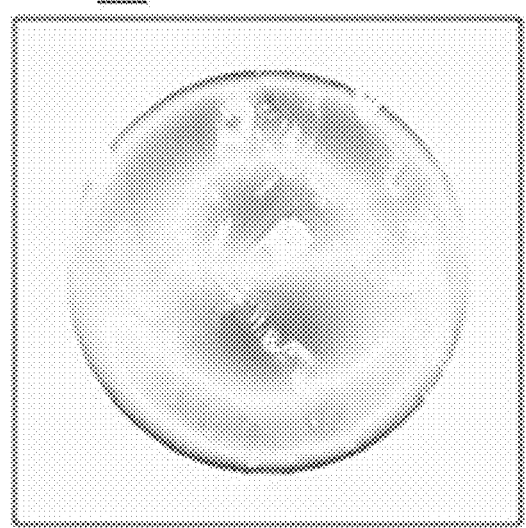

First, FIG. 10 may be an image 800 representing intensity distribution of EUV light measured on a light output surface, and FIG. 11 may be an image 810 representing phase distribution of EUV light measured on a light output surface. Referring to the image 800 of FIG. 10, relative intensity of EUV light may vary depending on a position on the light output surface. As illustrated in the image 810 of FIG. 11, a phase of EUV light may also vary depending on a position on the light output surface.

Figure 12:
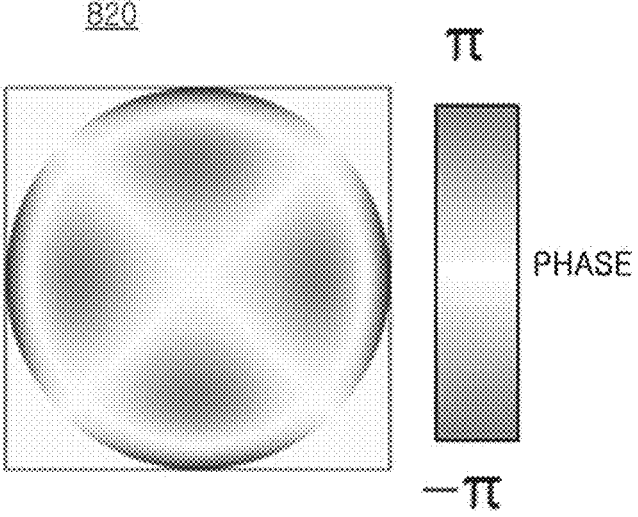
Figure 13:
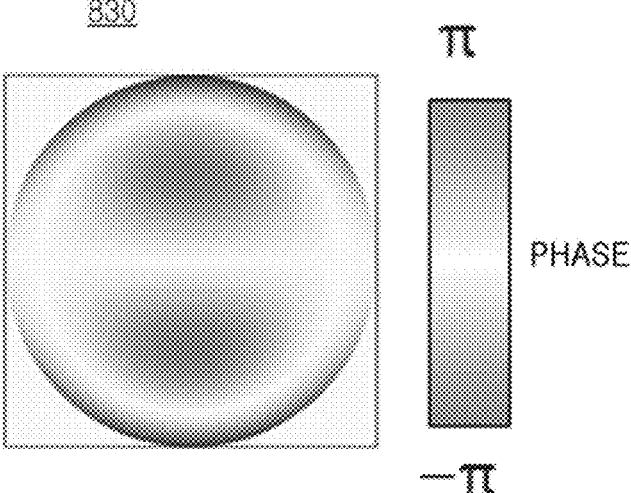

FIG. 12 may be an image 820 representing phase aberration of incident light and outgoing light of a first mirror included in an optical system. FIG. 13 may be an image 830 representing phase aberration of incident light and outgoing light of a second mirror included in an optical system. As illustrated in FIGS. 12 and 13, the phase aberration of the incident light and the outgoing light of the first mirror may have a form different from that of the phase aberration of the incident light and the outgoing light of the second mirror.

A controller of a semiconductor processing apparatus may generate a plurality of wavefront images corresponding to the images 800 to 830 illustrated in FIGS. 10 to 13, using a predictive image output by an optical prediction model modeling optical elements included in the semiconductor processing apparatus. In this case, as described above, before the plurality of wavefront images are generated, the optical prediction model may be optimized by a backward propagation operation using a difference between a predictive image and an original image so as to secure consistency between the predictive image and the original image. When the optimization of the optical prediction model is completed, for example, when a difference between the predictive image and the original image is reduced to be smaller than a reference difference and thus consistency is recognized, the controller may generate the plurality of wavefront images based on the predictive image generated by the optical prediction model, and the wavefront images may be compared with the images 800 to 830 illustrated in FIGS. 10 to 13 to diagnose a state of each of the optical elements.

Figure 14:
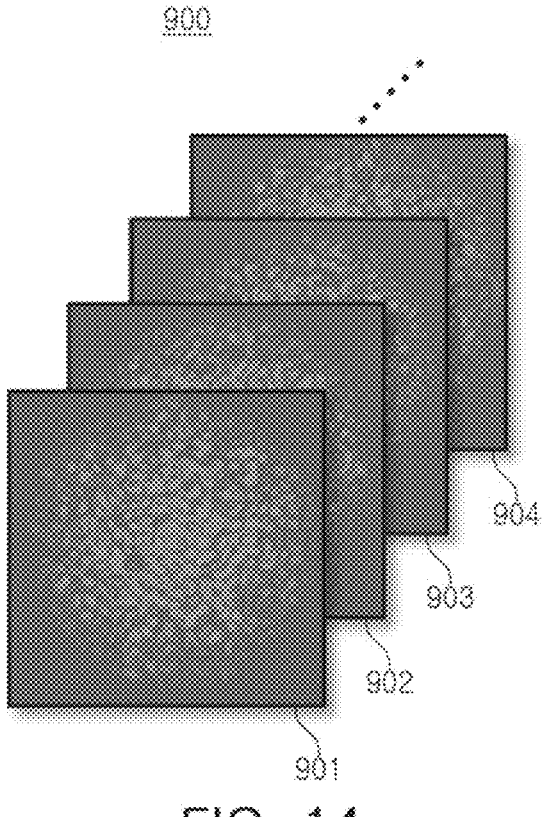
FIG. 14 is a diagram illustrating predictive images generated in a method of managing a semiconductor processing apparatus according to an example embodiment.

FIG. 14 is a diagram illustrating predictive images generated in a method of managing a semiconductor processing apparatus according to an example embodiment. FIGS. 15 to 20 are diagrams illustrating a plurality of wavefront images generated in a method of managing a semiconductor processing apparatus according to an example embodiment.

A plurality of predictive images 900 (901, 902, 903, and 904) may be disposed on a mask stage to respectively correspond to some regions of a diffuser diffusing EUV light. For example, as described above with reference to FIG. 4, a plurality of regions may be defined in the diffuser. EUV light, diffused in each of the plurality of regions defined in the diffuser, may pass through an optical system, and then a diffraction pattern of a wafer stage may be predicted using an optical prediction model, such that the plurality of predictive images 900 may be generated. For example, a first predictive image 901 may be an image predicting a diffraction pattern of EUV light diffused in a first region of the diffuser, and a second predictive image 902 may be an image predicting a diffraction pattern of EUV light diffused in a second region of the diffuser.

When an image sensor outputs a plurality of original images in response to EUV light diffused in each of the plurality of regions defined in the diffuser, the optical prediction model may be optimized until consistency between the plurality of predictive images 900 and the plurality of original images is recognized. For example, the optical prediction model may include a plurality of prediction models modeling optical characteristics of each of optical elements included in the semiconductor processing apparatus, and at least one of the plurality of prediction models may be modified in the process of optimizing the optical prediction model. When the optimization of the optical prediction model is completed, a plurality of wavefront images corresponding to the optical elements may be generated using the plurality of prediction models. Hereinafter, it will be described with reference to FIGS. 15 to 20.

Figure 15:
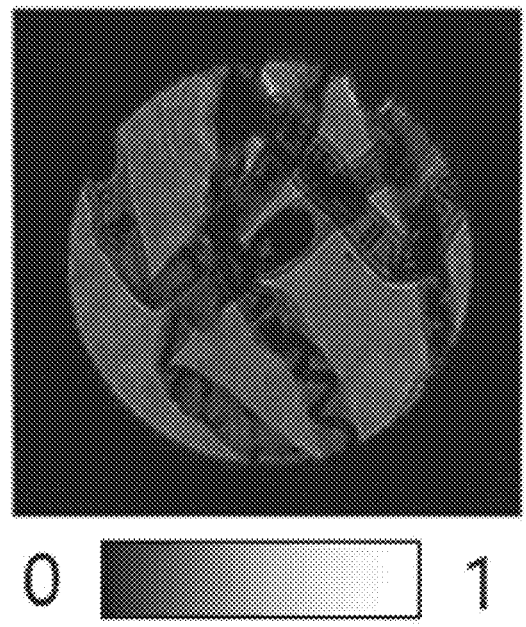
FIGS. 15, 16, 17, 18, 19, and 20 are diagrams illustrating a plurality of wavefront images generated in a method of managing a semiconductor processing apparatus according to an example embodiment.
Figure 16:
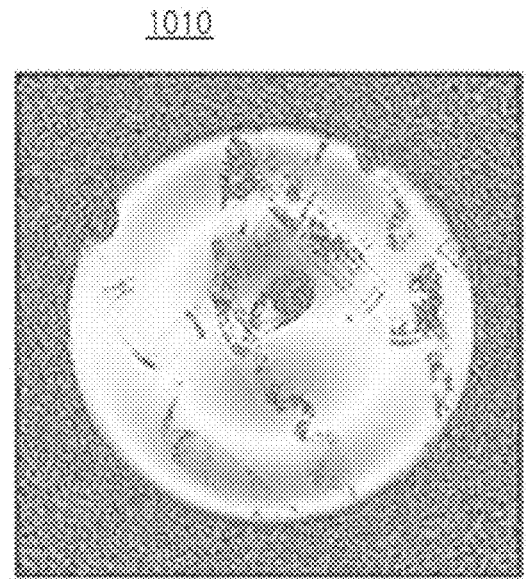

First, FIG. 15 may be a first light source image 1000 generated by a prediction model estimating intensity distribution of EUV light on a light output surface, and FIG. 16 may be a second light source image 1010 generated by a prediction model estimating phase distribution of EUV light on a light output surface. Thus, a controller of the semiconductor processing apparatus may generate the first light source image 1000 and the second light source image 1010, using a prediction model of the optimized optical prediction model corresponding to a light source.

The controller may compare the first light source image 1000 of FIG. 15 with the image 800 illustrated in FIG. 10, and may diagnose, based on a difference therebetween, whether there is an issue in an output of the light source. In addition, the controller may compare the second light source image 1010 of FIG. 16 with the image 810 illustrated in FIG. 11 to diagnose whether there is an issue in phase distribution of EUV light output by the light source. Thus, the controller may more rapidly determine whether there is an issue in the light source, using the first light source image 1000 and the second light source image 1010.

For example, a light source included in the semiconductor processing apparatus may output EUV light, using plasma. The light source may operate using a laser-produced plasma (LPP) method in which plasma is generated by irradiating a droplet formed of one of materials such as tin, lithium, xenon, and the like with a high-power laser, or using a master oscillator power amplifier (MOPA) method. The irradiated high-power laser may form plasma while colliding with a droplet supplied by a droplet supply unit, and thus, an illumination mirror, a collector, and the like for re-condensing EUV light formed by the plasma may be included in the light source.

The collector may function as a type of reflector, and may be positioned relatively close to the droplet to increase re-condensing efficiency. However, in this case, a by-product may occur while plasma is generated as the droplet collides with a laser. The by-product may contaminate a surface of the collector and reduce reflectance.

In an example embodiment, as described with reference to FIGS. 15 and 16, light source images 1000 and 1010 representing intensity distribution and phase distribution of EUV light output by a light source on a light output surface, perpendicular to an optical axis of the EUV light, may be generated. The generated light source images 1000 and 1010 may be compared with images 800 and 810 generated by actual measurement, thereby rapidly determining whether the collector is contaminated and whether cleaning is necessary accordingly. As a result, an operation of maintaining and repairing the semiconductor processing apparatus may be efficiently performed.

Figure 17:
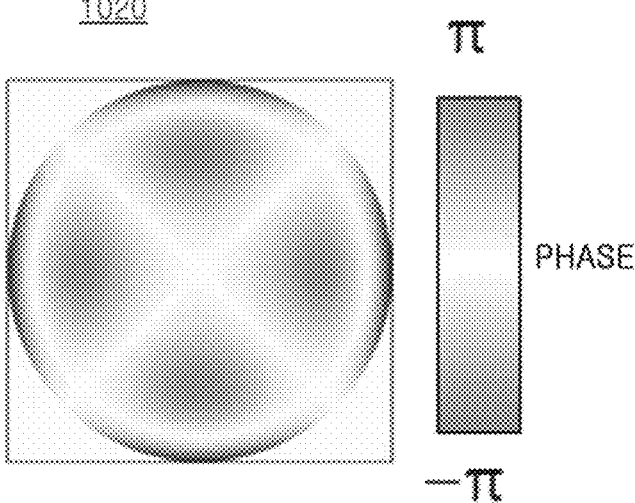

Next, FIG. 17 may be a first mirror image 1020 generated by a prediction model estimating phase aberration between incident light and outgoing light of a first mirror included in an optical system. When a prediction model corresponding to the first mirror generates the first mirror image 1020, a controller may execute orthogonal decomposition or matrix decomposition on the first mirror image 1020 to analyze optical characteristics of the first mirror.

Figure 18:
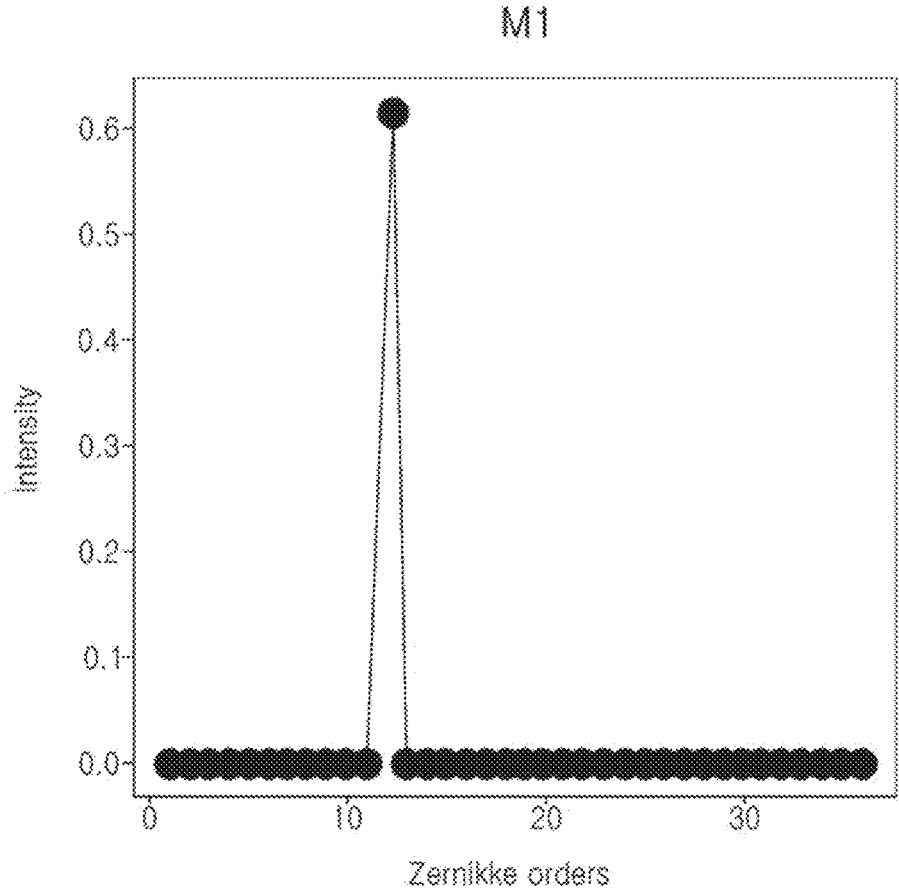

For example, referring to FIG. 18, the controller may execute orthogonal decomposition on the first mirror image 1020 using a Zernike polynomial. In the example embodiment illustrated in FIGS. 17 and 18, the first mirror image 1020 may be represented by $$Z_4^2$$

among terms of the Zernike polynomial. Accordingly, the controller may diagnose that phase aberration, having a form similar to that of secondary astigmatism, occurs in the first mirror. The controller may compare the first mirror image 1020 with the image 820 actually measuring the phase aberration of the first mirror, as illustrated in FIG. 12.

Figure 19:
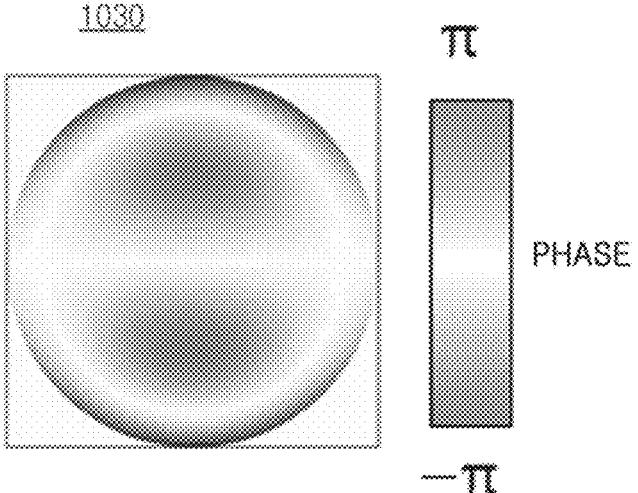

Next, FIG. 19 may be a second mirror image 1030 generated by a prediction model estimating phase aberration between incident light and outgoing light of a second mirror included in an optical system. When a prediction model corresponding to the second mirror generates the second mirror image 1030, the controller may execute orthogonal decomposition or matrix decomposition on the second mirror image 1030 to analyze optical characteristics of the second mirror.

Figure 20:
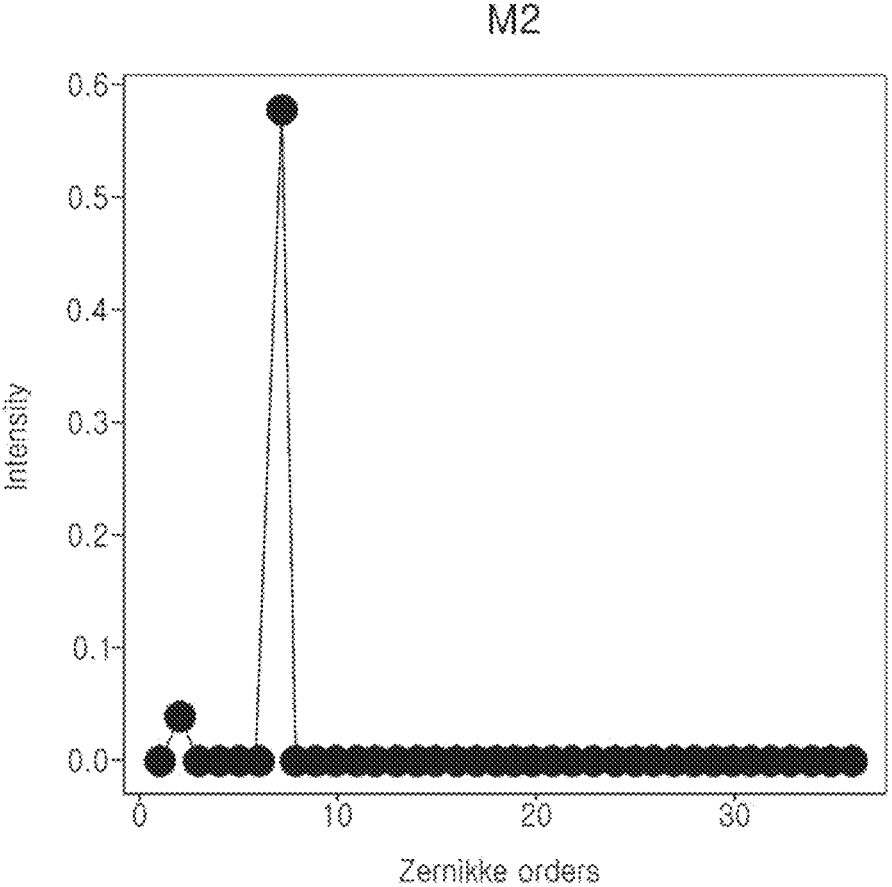

For example, the controller may execute orthogonal decomposition on the second mirror image 1030. Referring to FIG. 20, the controller may execute orthogonal decomposition on the first mirror image 1020 using a Zernike polynomial. In the example embodiment illustrated in FIGS. 19 and 20, the second mirror image 1020 may be represented by $$Z_1^{-1} \text{ and } Z_3^{-1}$$

among terms of the Zernike polynomial. The controller may compare the second mirror image 1030 with the image 830 actually measuring the phase aberration of the second mirror, as illustrated in FIG. 13, thereby determining whether the second mirror is contaminated and an error occurs accordingly.

According to an example embodiment, a diffuser may be installed on a mask stage, and an image sensor may be installed on a wafer stage. In such a state, a plurality of wavefront images, representing amplitude modulation, phase aberration, and the like of a surface of each of optical elements included in a semiconductor processing apparatus, may be generated by irradiating the diffuser with EUV light multiple times. Thus, optical properties of each of the optical elements included in the semiconductor processing apparatus using the EUV light may be individually determined, and the semiconductor processing apparatus may be efficiently maintained and repaired, thereby improving yield of a semiconductor process.

While example embodiments have been described with reference to the figures, it will be understood by those of ordinary skill in the art that various changes in form and details may be made therein without departing from the spirit and scope as defined by the following claims and their equivalents.

What is claimed is:

1. A method of managing a semiconductor processing apparatus, the method comprising:

irradiating, by a light source, a plurality of regions included in a diffuser on a mask stage with extreme ultraviolet (EUV) light;

reflecting or transmitting, by the diffuser, the EUV light;

transmitting, by an optical system, the EUV light from the diffuser;

receiving, by an image sensor, the EUV light from the optical system, obtaining, by the image sensor, a plurality of original images corresponding to the plurality of regions;

generating, based on an optical prediction model to which optical characteristics of the light source, the diffuser, and the plurality of mirrors are applied, a plurality of predictive images estimating a diffraction pattern in the image sensor;

adjusting an optical prediction model by comparing the plurality of predictive images with the plurality of original images, until consistency between the plurality of predictive images and the plurality of original images is obtained; and generating, based on the optical prediction model, a plurality of wavefront images corresponding to optical characteristics of each of the plurality of mirrors, based on the consistency between the plurality of predictive images and the plurality of original images being obtained.

2. The method of claim 1, wherein the image sensor is on a wafer stage.

3. The method of claim 2, wherein the image sensor is on a position of the wafer different from a position of a focal plane of light passing through the optical system and incident on the wafer.

4. The method of claim 1, wherein each of the plurality of wavefront images correspond to at least one of amplitude modulation of the EUV light and phase aberration of the EUV light on one of a light output surface between the light source and the diffuser, and a surface of each of the plurality of mirrors.

5. The method of claim 1, further comprising executing a backward propagation operation based on a difference between the plurality of predictive images and the plurality of original images to adjust the optical prediction model.

6. The method of claim 5, wherein the optical prediction model includes a mirror prediction model reflecting at least one of amplitude modulation and phase aberration between incident light and outgoing light of each of the plurality of mirrors, and wherein the mirror prediction model for at least one mirror, among the plurality of mirrors, is modified in the backward propagation operation.

7. The method of claim 1, wherein the consistency between the plurality of predictive images and the plurality of original images is obtained based on a difference between the plurality of predictive images and the plurality of original images being smaller than a predetermined reference difference.

8. The method of claim 1, wherein the plurality of predictive images correspond to the plurality of regions.

9. The method of claim 1, wherein the optical prediction model includes a diffusion prediction model corresponding to optical characteristics of each of the plurality of regions, and wherein the generating the plurality of predictive images comprises arbitrarily generating the diffusion prediction model for each of the plurality of regions.

10. The method of claim 1, wherein the acquiring the plurality of original images comprises irradiating the plurality of regions with the EUV light while moving the mask stage.

11. The method of claim 1, wherein optical characteristics of the plurality of mirrors are obtained by executing orthogonal decomposition or matrix decomposition on some wavefront images corresponding to the plurality of mirrors, among the plurality of wavefront images, based on the consistency between the plurality of predictive images and the plurality of original images being obtained.

12. The method of claim 1, wherein the plurality of mirrors comprise a first mirror and a second mirror, and wherein the plurality of wavefront images comprise a first mirror image corresponding to phase aberration between incident light and outgoing light of the first mirror, and a second mirror image representing phase aberration between incident light and outgoing light of the second mirror.

13. The method of claim 12, wherein aberration and contamination of the first mirror is determined based on the first mirror image, and wherein aberration and contamination of the second mirror is determined based on the second mirror image.

14. The method of claim 1, wherein the plurality of wavefront images comprise a light source image corresponding to at least one of an amplitude and a phase of a light output surface, perpendicular to an optical axis of the EUV light, between the light source and the diffuser.

15. The method of claim 14, further comprising diagnosing states of an illumination mirror and a collector, included in an illumination optical system between the light source and the diffuser, based on the light source image.

* * * * *